(12) United States Patent
Chiola

(10) Patent No.: US 7,973,381 B2
(45) Date of Patent: Jul. 5, 2011

(54) THICK FIELD OXIDE TERMINATION FOR TRENCH SCHOTTKY DEVICE

(75) Inventor: Davide Chiola, Marina del Rey, CA (US)

(73) Assignee: International Rectifier Corporation, El Segundo, CA (US)

(*) Notice: Subject to any disclaimer, the term of this patent is extended or adjusted under 35 U.S.C. 154(b) by 49 days.

(21) Appl. No.: 10/936,162

(22) Filed: Sep. 8, 2004

(65) Prior Publication Data

US 2005/0062124 A1    Mar. 24, 2005

Related U.S. Application Data

(60) Provisional application No. 60/501,009, filed on Sep. 8, 2003.

(51) Int. Cl.
*H01L 29/66* (2006.01)

(52) U.S. Cl. ......... 257/483; 257/E33.051; 257/E29.013; 438/570

(58) Field of Classification Search ........... 257/E21.359, 257/E29.338, E29.359, 471–486, E33.051, 257/E29.013; 438/534, 570
See application file for complete search history.

(56) References Cited

U.S. PATENT DOCUMENTS

| | | | | |
|---|---|---|---|---|
| 5,614,751 A | * | 3/1997 | Yilmaz et al. | 257/394 |
| 6,184,563 B1 | * | 2/2001 | Yu | 257/471 |
| 6,309,929 B1 | * | 10/2001 | Hsu et al. | 438/270 |
| 6,404,033 B1 | * | 6/2002 | Chang et al. | 257/484 |
| 6,621,107 B2 | * | 9/2003 | Blanchard et al. | 257/155 |
| 6,657,255 B2 | * | 12/2003 | Hshieh et al. | 257/330 |
| 6,740,951 B2 | * | 5/2004 | Tsui et al. | 257/483 |
| 6,798,018 B2 | * | 9/2004 | Takaishi et al. | 257/334 |
| 6,833,584 B2 | * | 12/2004 | Henninger et al. | 257/334 |
| 6,855,593 B2 | * | 2/2005 | Andoh et al. | 438/237 |
| 6,855,986 B2 | * | 2/2005 | Hsieh et al. | 257/339 |
| 6,940,145 B2 | * | 9/2005 | Blair et al. | 257/510 |
| 7,087,958 B2 | * | 8/2006 | Chuang et al. | 257/335 |
| 2001/0010385 A1 | * | 8/2001 | Hijzen et al. | 257/471 |
| 2003/0040144 A1 | * | 2/2003 | Blanchard et al. | 438/145 |
| 2003/0209757 A1 | * | 11/2003 | Henninger et al. | 257/329 |

OTHER PUBLICATIONS

Hsu et al., "A novel trench termination design for 100-V TMBS diode application", Electron Device Letters, IEEE, vol. 22, Issue 11, Nov. 2001 pp. 551-552.*

* cited by examiner

*Primary Examiner* — Thao X Le
*Assistant Examiner* — William F Kraig
(74) *Attorney, Agent, or Firm* — Farjami & Farjami LLP

(57) ABSTRACT

A schottky diode of the trench variety which includes a trench termination having a thick insulation layer that is thicker than the insulation layer inside the trenches in its active region.

18 Claims, 5 Drawing Sheets

THICK FIELD OXIDE TERMINATION FOR TRENCH SCHOTTKY DEVICE

RELATED APPLICATION

This application is based on and claims benefit of U.S. Provisional Application No. 60/501,009, filed on Sep. 8, 2003, entitled Thick Field Oxide Termination For Trench Schottky Device and Process for Manufacture, to which a claim of priority is hereby made and the disclosure of which is incorporated herein by reference.

BACKGROUND OF THE INVENTION

Trench schottky diodes are known. An example of a trench schottky diode is shown in the copending application Ser. No. 10/193,783, filed Jul. 11, 2002 and assigned to the assignee of the present invention.

The device shown in application Ser. No. 10/193,783 includes an active region that includes a plurality of trenches, and a termination region which includes a termination trench. In the device shown in application Ser. No. 10/193,783 the sidewalls and the bottoms of the trenches in the active region, and the sidewalls and the bottom of the termination trench are lined with an oxide layer, which is formed simultaneously in the trenches of the active region and the termination trench.

The thickness of the oxide layer in the active region is related to the breakdown voltage (BV) of the device. Thus, for an epitaxial silicon of a given resistivity in which trenches are formed, there is an optimum oxide thickness that provides the maximum BV for the trenches. However, the thickness of the oxide in the termination trench mainly affects reverse voltage stability and ruggedness.

Because the thickness of the oxide in the active region and the thickness of the oxide in the termination region are about the same, there is a possibility that the termination will breakdown prior to the active region. This premature breakdown will reduce the overall efficiency of the device.

SUMMARY OF THE INVENTION

In a device according to the present invention the oxide in the termination region is made thicker than the oxide in the active region in order to overcome the drawback of the prior art devices.

In addition, a thicker oxide in the termination region confines the avalanche breakdown in the active region. This improves the reverse avalanche absorption capability in a destructive avalanche test, because the entire active region, which is wider than the termination region, is invested by the avalanche energy, whereby higher energy can be dissipated before failure.

Moreover, a thicker termination oxide in the termination region will avoid "BV Walk-Out" by releasing the electric field under the tip of the field plate.

Finally, the mechanical strength of the termination region is improved such that the device is less likely to fail during temperature cycles due to oxide repture under the tip of the metal field plate.

Other features and advantages of the present invention will become apparent from the following description of the invention which refers to the accompanying drawings.

DETAILED DESCRIPTION OF THE FIGURES

Figure 1:
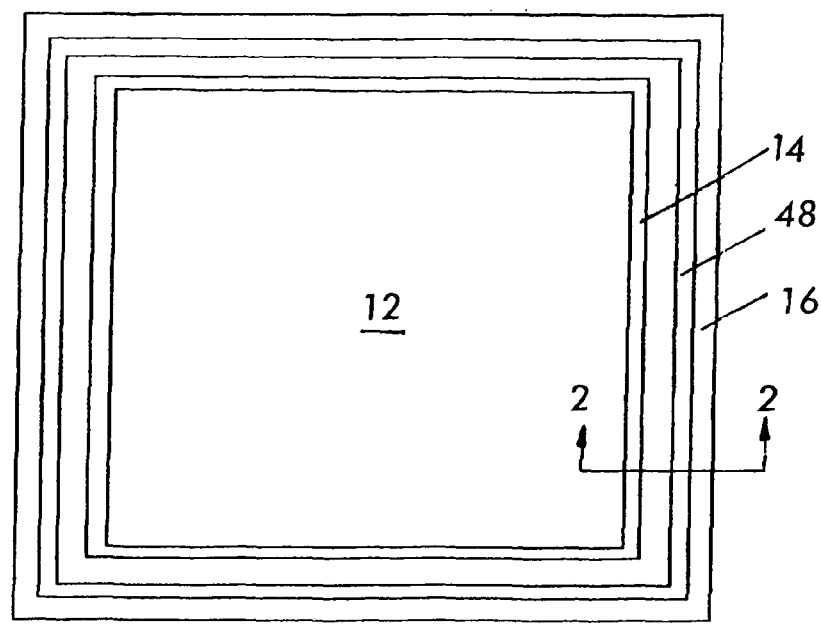
FIG. 1 shows a top plan view of a schottky diode according to the present invention.
Figure 2:
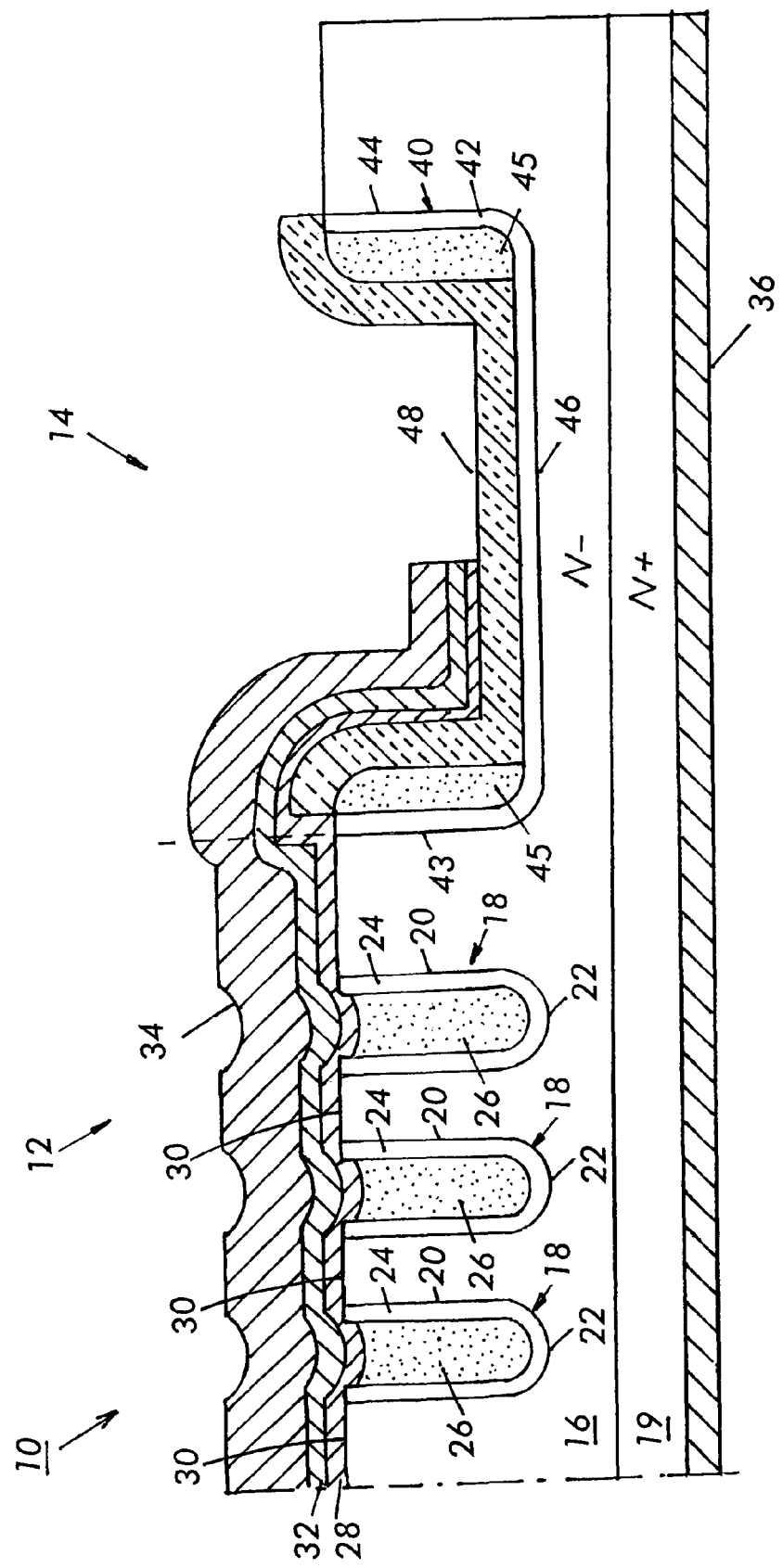
FIG. 2 shows a cross-sectional view of the schottky diode illustrated in FIG. 1 along line 2-2 and viewed in the direction of the arrows.

Referring now to FIGS. 1 and 2, a semiconductor device according to the preferred embodiment of the present invention is a trench type schottky diode 10, which includes active region 12 and termination region 14 both formed in a semiconductor body. The semiconductor body may be a silicon die which includes an N− epitaxial silicon 16 formed over an N+ silicon substrate 19.

In the preferred embodiment of the present invention, active region 12 includes a plurality of spaced trenches 18 each having opposing sidewalls 20 and a bottom 22, a first insulation layer 24 formed over bottom 22 and sidewalls 20 of each trench 18, and a conductive body 26 disposed within each trench 18 over a respective insulation layer 24. In the preferred embodiment, first insulation layer 24 may be silicon dioxide and conductive body 26 may be P type polysilicon.

A schottky diode according to the preferred embodiment further includes a schottky metal layer 28 in schottky contact with mesa 30 regions between trenches 18, an interlayer 32 formed over schottky metal layer 28, and a contact layer 34 formed over interlayer 32. In the preferred embodiment, schottky metal layer 28 may be composed of palladium, interlayer 32 may be composed of molybdenum and contact layer 34 may be composed of aluminum or aluminum silicon. Schottky diode 10 according to the present invention further includes cathode contact 36 formed over substrate 19. Cathode contact 36 includes a solderable outer surface composed of a trimetal combination.

Termination region 14 in the preferred embodiment of the present invention includes termination trench 38 which surrounds active region 12. Termination trench 40 includes inner sidewall 43 (the sidewall that is adjacent active region 12), outer sidewall 44, and bottom 46. In the preferred embodiment, insulation layer 42, which is formed preferably from silicon dioxide is disposed on sidewalls 43,44 and bottom 46 of termination trench 40, and conductive spacers 45 are formed on insulation layer 42 on sidewalls 43, 44.

Termination region 14 further includes thick insulation 48 formed preferably of silicon dioxide and disposed over conductive spacers 45 and insulation 42 on bottom 46 of termination trench 40. In the preferred embodiment, Schottky layer 28, interlayer 32 and contact layer 34 extend from active region 12 along inner sidewall 43 of termination trench 40 over at least a portion of bottom 46 of trench 40, and terminate before reaching outer sidewall 44.

According to an aspect of the present invention, thick insulation layer 48 is thicker than first insulation layer 24 in each trench 18.

Thus, for example, in a mid-voltage Schottky diode rated at about 100V, insulation layer 24 in trenches 18 may be about 4000 Å thick, while the total thickness of thick insulation 48 and insulation layer 42 in termination trench 40 may be about 10000 A (1 um) thick.

Table 1 sets forth electrical characteristics of a 100V device according to the present invention and a 100V planar conventional Schottky diode with a guard ring termination.

TABLE 1

| Type | Planar | Trench |
|---|---|---|
| Die Size [mls] | 150x180 | 115X170 |
| Guard Ring | YES | NO |
| Epi res [Ohm-cm] | 2.45 | 1.25 |
| Epi thickness [um] | 10 | 7.5 |
| Package | TO220 | TO220 |
| BV@20 mA [V] | 117.3 | 118.8 |
| Vf@25 A@25 C. [V] | 0.757 | 0.663 |
| Vf@25 A@125 C. [V] | 0.623 | 0.607 |
| Ir@100 V@25 C. [A] | 1.69E-05 | 5.90E-06 |
| Ir@100 V@125 C. [A] | 1.43E-02 | 5.90E-03 |

As seen in Table 1, a schottky diode with a thick insulation 48 according to the present invention can have a leakage current that is three times lower than a conventional planar device with a guard ring termination.

Furthermore, a schottky diode according to the present invention provides a 12% lower forward voltage drop at 25° C. despite being 20% smaller than a conventional planar device. It should also be noted that in a device according to the present invention, the same breakdown voltage as a planar device can be achieved with half the resistivity in epitaxial layer 16 (1.25 vs.2.45 Ohm-cm). Thus, a lower forward voltage drop can be achieved by using a epitaxial layer 16 of lower resistivity and thickness if a structure according to the present invention is used.

Figure 3:
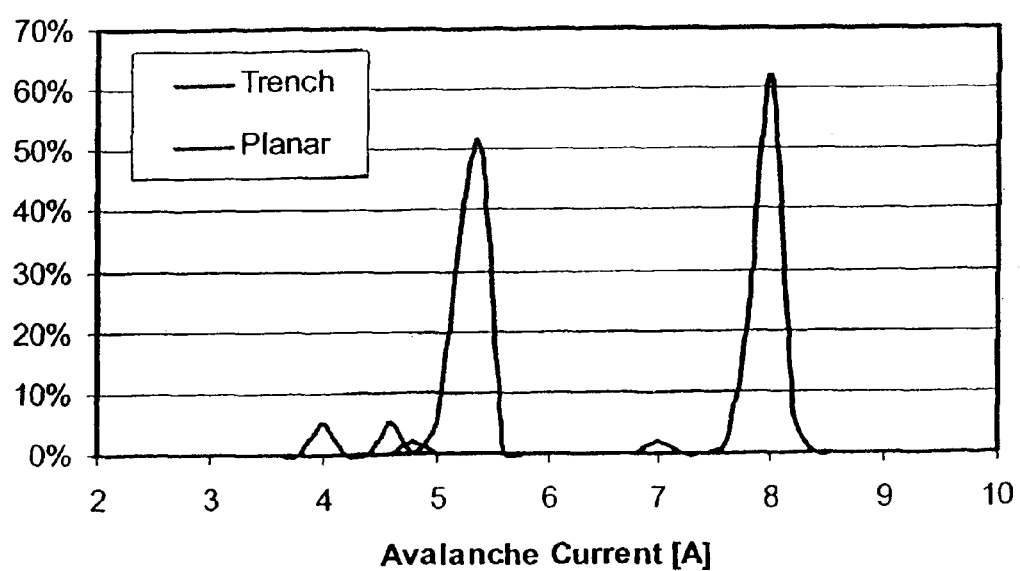
FIG. 3 shows a graphical comparison of the electrical characteristics of a device according to the present invention to a conventional planar device.

FIG. 3 shows the ruggedness of the new termination design in a destructive avalanche test. As can be seen in FIG. 3 a schottky diode according to the present invention is able to absorb 50% more current before failing than a planar schottky diode with 28% more silicon area.

Figure 4:
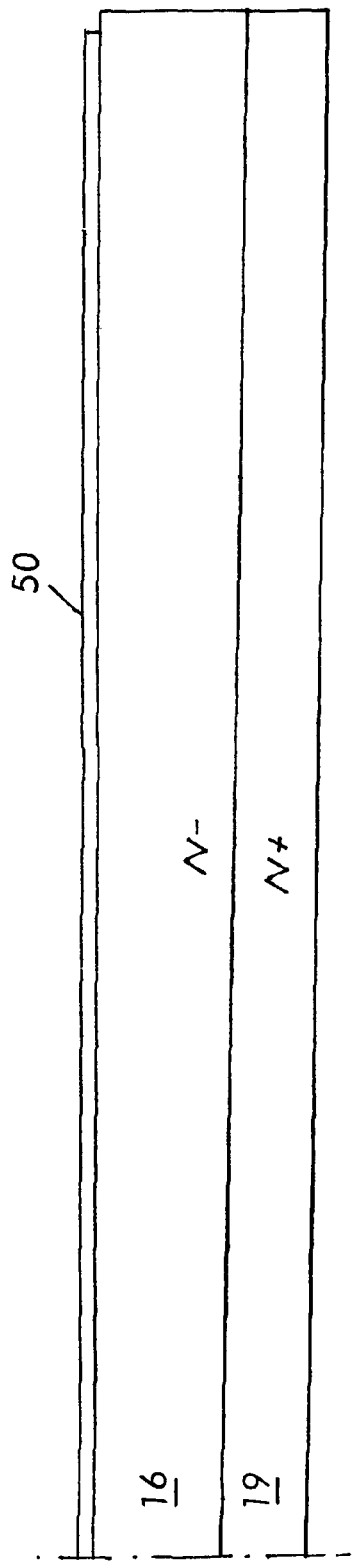
FIGS. 4-8 illustrate selected steps in manufacturing a device according to the present invention.

Referring now to FIG. 4, there is shown a semiconductor body which includes N− epitaxial silicon 16 formed over N+ silicon substrate 19. A nitride layer 50 is first deposited atop epitaxial silicon 16 to a preferred thickness of 600 Å to 800 Å. Thereafter, using photolithography and etching trenches 18 and termination trench 40 are defined in epitaxial silicon 16 to obtain the structure shown in FIG. 5. Trenches 18 in the preferred embodiment are about 0.8 microns, while termination trench 40 is preferably 70 microns wide. Also, preferably inner sidewall 43 of termination trench 40 is about two microns away from the closest trench 18 to termination trench 40. It should be noted that trenches 18 may be either stripes or cellular in structure.

Figure 6:
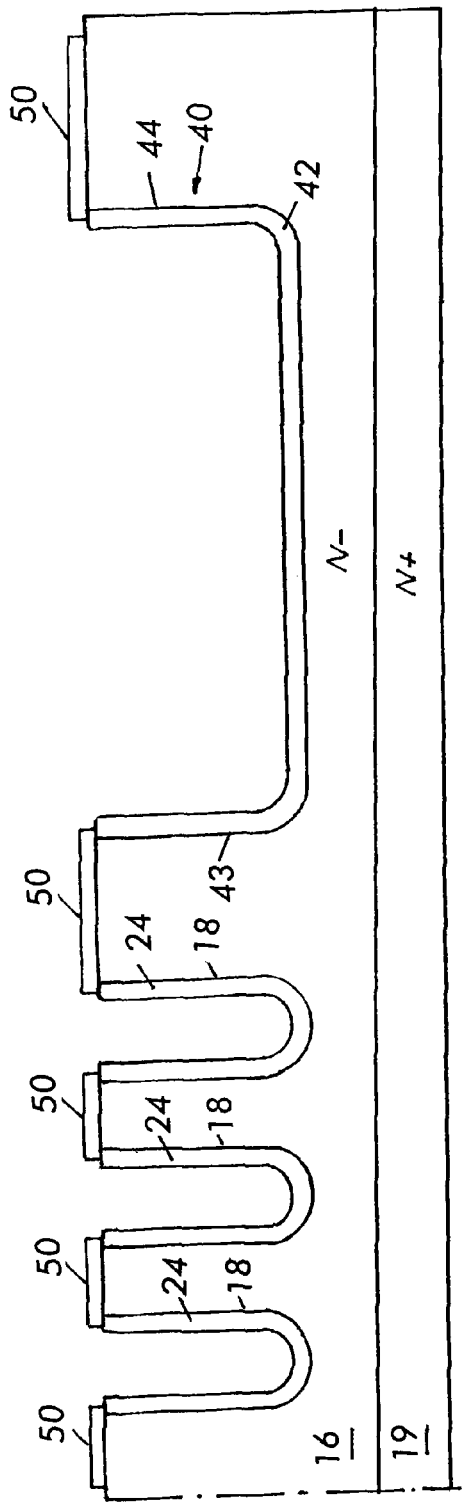

After trenches 18 and trench 40 are defined, sidewalls 20 and bottom 22 of trenches 18, and sidewalls 43,44 and bottom 46 of termination trench 40 are oxidized in an oxidation step to form first insulation layers 24 and insulation layer 42, thus obtaining the structure shown in FIG. 6.

In the preferred embodiment, first insulation layers 24 and insulation layer 42 are preferably 4000 Å thick. It should be noted that areas covered by nitride layer 50 are not oxidized in that the nitride layer is an oxidation retardant.

Figure 5:
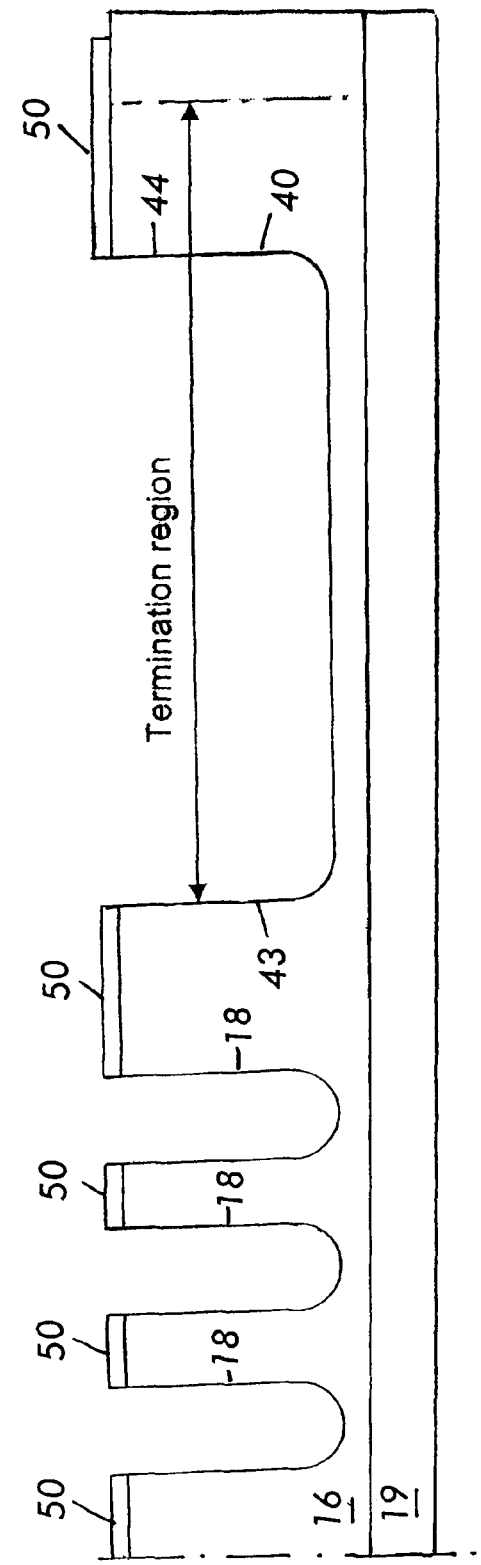
Figure 7:
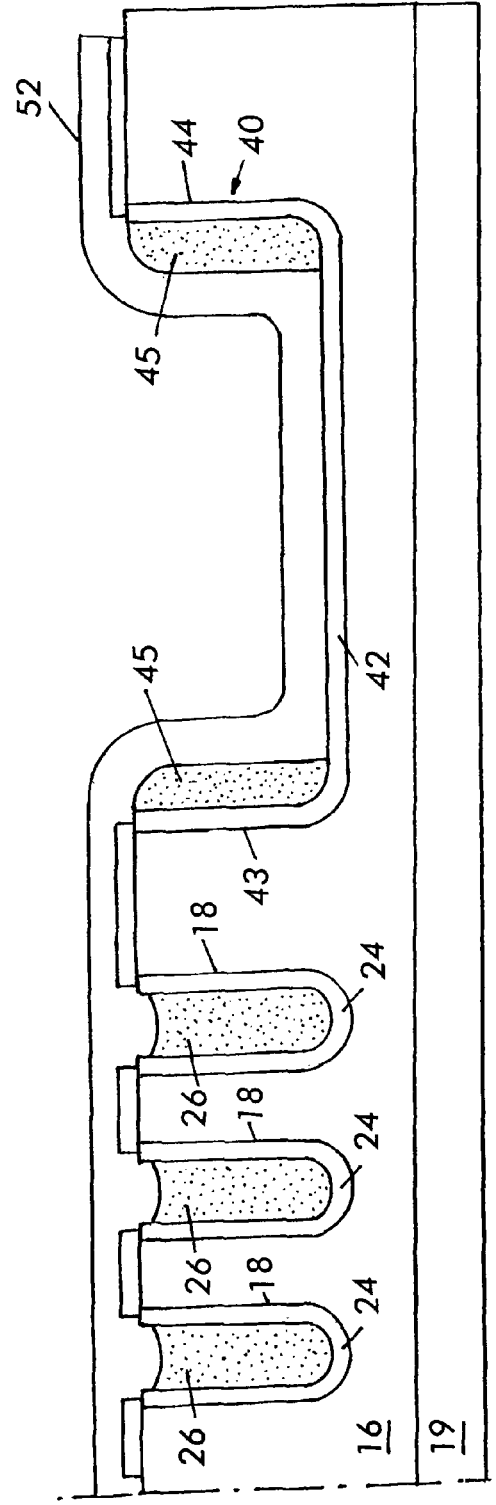

Referring next to FIG. 7, conductive bodies 26 are formed in trenches 18 by first depositing a layer of polysilicon over the structure shown in FIG. 5, implanting and driving P type impurities such as boron atoms into the polysilicon, and then removing as much of the polysilicon as necessary to only leave polysilicon in trenches 18 to form conductive bodies 26, and conductive spacers 45 in termination trench 40. Thereafter, a layer of TEOS 52 is deposited. In the preferred embodiment, TEOS 52 is about 7000 Å thick.

Figure 8:
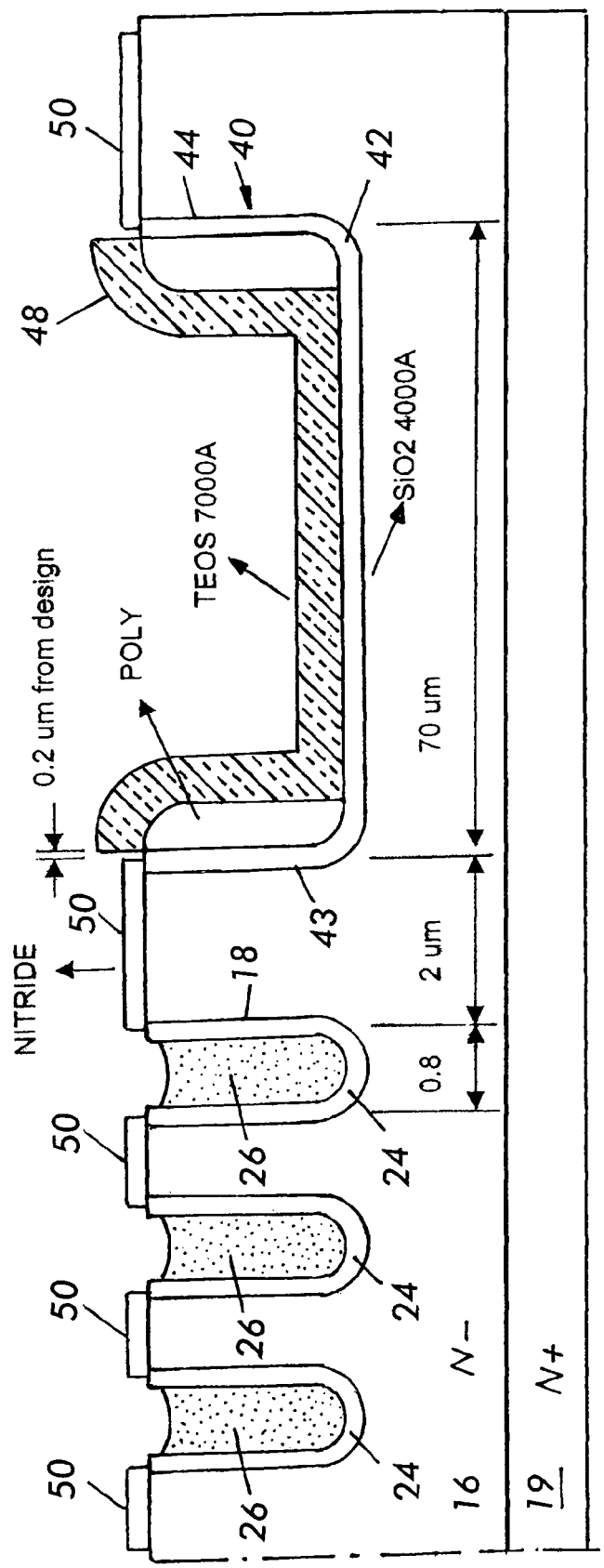

Referring next to FIG. 8, in another mask step TEOS 52 is removed from active region 12 and preferably any other region except for termination trench 40, thereby defining thick insulation 48 in termination trench 40.

Thereafter, a wet nitride etch removes nitride layers 50 and Schottky barrier layer 28 is formed followed by interlayer 32 and contact layer 34. In the preferred embodiment schottky layer 28 is formed of palladium and is 30 Å thick, interlayer 32 is formed with molybdenum and is 3000 Å thick, and contact layer 34 is formed from aluminum and is 4 micrometers thick.

In another mask operation, schottky layer 28, interlayer 32 and contact layer 34 are removed from portions of termination region 14 to obtain the structure seen in FIG. 2.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A Schottky diode comprising:
    a semiconductor body of one conductivity said semiconductor body including an active region and a termination region;
    a plurality of spaced trenches in said active region, each having opposing sidewalls and a bottom;
    a first insulation layer of a first thickness on said sidewalls and said bottom of each of said trenches;
    a semiconductor mesa disposed between each pair of spaced trenches;
    a termination trench formed in said termination region, said termination trench including a first sidewall, a bottom wall, and another sidewall opposite said first sidewall;
    an insulation layer disposed on said first sidewall, said bottom wall, and said another sidewall of said termination trench;
    a conductive body having an inner surface disposed adjacent said insulation layer on said first sidewall and said bottom wall of said termination trench, said conductive body including an outer surface opposite said inner surface thereof;
    a second insulation layer of a second thickness disposed in said termination trench and at least over said insulation layer in said termination trench; and
    a contact layer extending from said active region into said termination trench and disposed over said second insulation layer on said conductive body adjacent said first sidewall of said termination trench and terminating within said termination trench over said bottom wall of said termination trench so as not to extend over said another sidewall;
    wherein said second thickness is thicker than said first thickness;
    wherein said second insulation layer is disposed over and covers the entire outer surface of said conductive body, wherein said insulation layer disposed over said bottom wall of said termination trench extends beyond said conductive body and under said second insulation layer, spacing said second insulation layer from said bottom wall of said termination trench along the entire length of said bottom wall of said termination trench; and
    wherein said second insulation layer extends over the entire bottom wall and along said another sidewall of said termination trench.

2. A Schottky diode according to claim 1, further comprising a conductive body disposed inside each of said spaced trenches.

3. A Schottky diode according to claim 2, wherein said conductive body is comprised of polysilicon.

4. A Schottky diode according to claim 3, wherein said polysilicon is of another conductivity.

5. A Schottky diode according to claim 4, wherein said another conductivity is P type.

6. A Schottky diode according to claim 1, further comprising a Schottky metal layer in Schottky contact with said mesas.

7. A Schottky diode according to claim 6, further comprising an interlayer formed over said Schottky layer, said contact layer formed over said interlayer.

8. A Schottky diode according to claim 6, wherein said Schottky metal layer is comprised of palladium.

9. A Schottky diode according to claim 8, further comprising a molybdenum interlayer disposed over said Schottky, metal layer, wherein said contact layer is formed over said molybdenum interlayer.

10. A Schottky diode according to claim 9, wherein said contact layer is comprised of either aluminum or aluminum silicon.

11. A Schottky diode according to claim 7, wherein said Schottky metal layer, said interlayer and said contact layer extend over said first sidewall of said termination trench and at least a portion of said bottom wall of said termination trench.

12. A Schottky diode according to claim 1, wherein said semiconductor body is epitaxial silicon.

13. A Schottky diode according to claim 1, wherein said first conductivity is N-type.

14. A Schottky diode according to claim 1, wherein said first insulation layer is 4000 angstroms thick.

15. A Schottky diode according to claim 1, wherein said second insulation layer is 7000 angstroms thick.

16. A Schottky diode according to claim 1, wherein said second insulation layer is comprised of TEOS.

17. A Schottky diode according to claim 1, wherein said first insulation layer is comprised of silicon dioxide.

18. A Schottky diode according to claim 1, further comprising a second conductive body disposed between said second insulation layer and said insulation layer and extending along said another sidewall of said termination trench.

* * * * *

UNITED STATES PATENT AND TRADEMARK OFFICE
CERTIFICATE OF CORRECTION

| | | |
|---|---|---|
| PATENT NO. | : 7,973,381 B2 | Page 1 of 1 |
| APPLICATION NO. | : 10/936162 | |
| DATED | : July 5, 2011 | |
| INVENTOR(S) | : Davide Chiola | |

It is certified that error appears in the above-identified patent and that said Letters Patent is hereby corrected as shown below:

In the claims, column 5, lines 14-15, "Schottky, metal" should be changed to --Schottky metal--.

Signed and Sealed this
Twentieth Day of December, 2011

David J. Kappos
*Director of the United States Patent and Trademark Office*